(12) United States Patent
Reznicek et al.

(10) Patent No.: US 9,035,391 B2
(45) Date of Patent: May 19, 2015

(54) FIN FIELD EFFECT TRANSISTORS HAVING A NITRIDE CONTAINING SPACER TO REDUCE LATERAL GROWTH OF EPITAXIALLY DEPOSITED SEMICONDUCTOR MATERIALS

(71) Applicant: International Business Machines Corporation, Armonk, NY (US)

(72) Inventors: Alexander Reznicek, Troy, NY (US); Thomas N. Adam, Slingerlands, NY (US); Kangguo Cheng, Guilderland, NY (US); Paul C. Jamison, Hopewell Junction, NY (US); Ali Khakifirooz, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/294,319

(22) Filed: Jun. 3, 2014

(65) Prior Publication Data

US 2014/0264387 A1    Sep. 18, 2014

Related U.S. Application Data

(62) Division of application No. 13/666,386, filed on Nov. 1, 2012, now Pat. No. 8,802,513.

(51) Int. Cl.
*H01L 23/58* (2006.01)
*H01L 29/06* (2006.01)
*H01L 29/78* (2006.01)
*H01L 21/336* (2006.01)
*H01L 27/088* (2006.01)
*H01L 21/8234* (2006.01)
*H01L 29/66* (2006.01)

(52) U.S. Cl.
CPC .... *H01L 27/0886* (2013.01); *H01L 21/823431* (2013.01); *H01L 29/66553* (2013.01); *H01L 29/66795* (2013.01); *H01L 29/785* (2013.01); *H01L 2924/0002* (2013.01)

(58) Field of Classification Search
None
See application file for complete search history.

(56) References Cited

U.S. PATENT DOCUMENTS

2007/0108536 A1  5/2007  Ieong et al.
2011/0193164 A1  8/2011  Zhu

*Primary Examiner* — Brett Feeney
*Assistant Examiner* — Pamela E Perkins
(74) *Attorney, Agent, or Firm* — Scully, Scott, Murphy & Presser, P.C.; H. Daniel Schnurmann

(57) ABSTRACT

A fin field effect transistor including a plurality of fin structures on a substrate, and a shared gate structure on a channel portion of the plurality of fin structures. The fin field effect transistor further includes an epitaxial semiconductor material having a first portion between adjacent fin structures in the plurality of fin structures and a second portion present on outermost sidewalls of end fin structures of the plurality of fin structures. The epitaxial semiconductor material provides a source region and at drain region to each fin structure of the plurality of fin structures. A nitride containing spacer is present on the outermost sidewalls of the second portion of the epitaxial semiconductor material.

20 Claims, 8 Drawing Sheets

FIN FIELD EFFECT TRANSISTORS HAVING A NITRIDE CONTAINING SPACER TO REDUCE LATERAL GROWTH OF EPITAXIALLY DEPOSITED SEMICONDUCTOR MATERIALS

RELATED APPLICATION

This application is a divisional of U.S. patent application Ser. No. 13/666,386, filed Nov. 1, 2012, the entire content and disclosure of which is incorporated herein by reference.

BACKGROUND

The present disclosure relates to semiconductor devices, such as fin field effect transistors.

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

SUMMARY

In one aspect, a method of forming a semiconductor device is provided that includes forming a gate structure on a plurality of fin structures, and forming a nitride containing layer on each of the fin structures, wherein a first thickness of the nitride containing layer on outermost sidewalls of the plurality of fin structures is greater than a second thickness for the remainder of the nitride containing layer. The nitride containing layer is etched to remove the portions of the nitride containing layer having the second thickness. A remaining portion of the first thickness of the nitride containing layer provides a nitride containing spacer that is present on the outermost sidewalls of the plurality of fin structures. An epitaxial semiconductor material for the source regions and the drain regions may be formed on the plurality of fin structures.

In another aspect, a semiconductor device is provided that includes a plurality of fin structures on a substrate, and a gate structure on a channel portion of the plurality of fin structures. The semiconductor device includes source regions and drain regions that are provided by an epitaxial semiconductor material for each of the fin structures in the plurality of fin structures. A first portion of the epitaxial semiconductor material is present between adjacent fin structures in the plurality of fin structures. A second portion of the epitaxial semiconductor material is present on outermost sidewalls of end fin structures of the plurality of fin structures. The semiconductor device further includes a nitride containing spacer that is present on the outermost sidewalls of the second portion of the epitaxial semiconductor material.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1A:
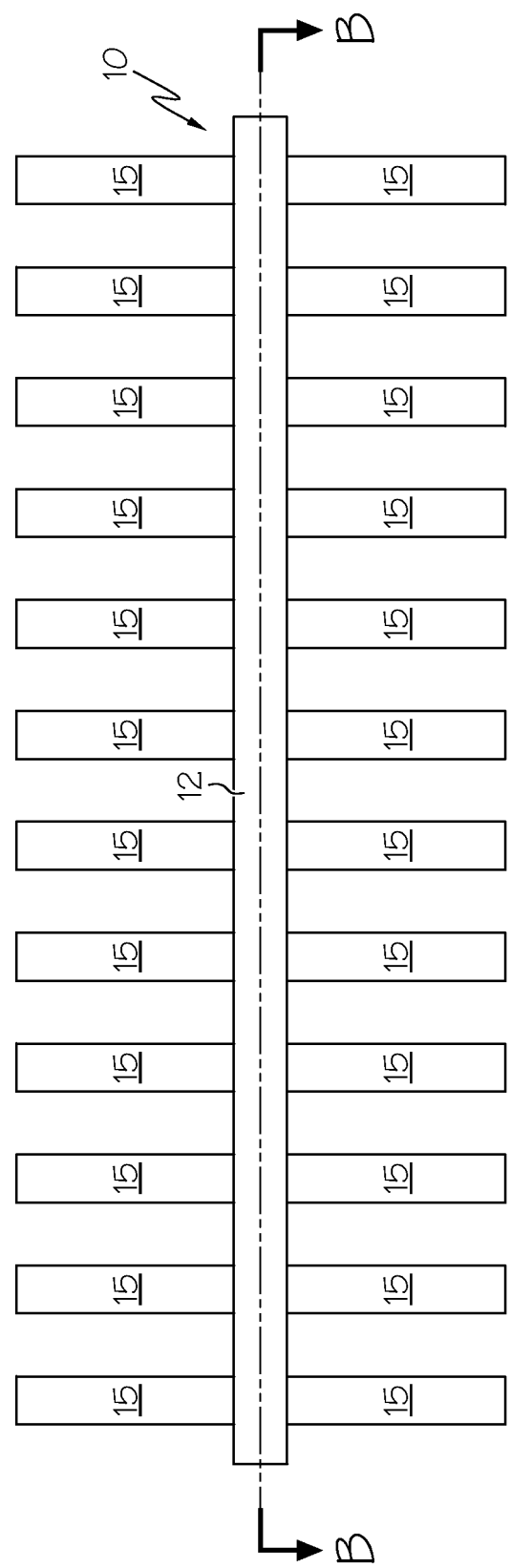
FIG. 1A is a top down view depicting forming a gate structure on a plurality of fin structures.

Detailed embodiments of the present disclosure are described herein; however, it is to be understood that the disclosed embodiments are merely illustrative of the structures and methods disclosed herein. In addition, each of the examples given in connection with the various embodiments of the disclosure is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present disclosure. For purposes of the description hereinafter, the terms "upper", "lower", "vertical", "horizontal", "top", "bottom", and derivatives thereof shall relate to the invention, as it is oriented in the drawing figures.

The following methods and structures are related to fin field effect transistors (finFETs). A fin field effect transistor is a field effect transistor including a channel located in a fin structure. As used herein, a "fin structure" refers to a semiconductor material, which is employed as the body of a semiconductor device, in which the gate structure of the semiconductor device is positioned around the fin structure such that charge flows down the channel on two sidewalls of the fin structure and optionally along a top surface of the fin structure. Fin field effect transistors employ vertical surfaces of semiconductor fin structures to effectively increase a device area without increasing the physical layout area of the device.

Typically, for arrays of fin field effect transistors having a tight pitch, it has been determined that epitaxially grown semiconductor material for the source regions and the drain regions on the fin structures of the fin field effect transistors at the end of the array may be the source of electrical shorting of the fin field effect transistors. For example, the epitaxial semiconductor material that provides one of the source region and the drain region of the fin field effect transistor at the end of the array can extend beyond the end of the gate structure to contact the other of the source region and the drain region, which can result in an electrical short. In another example, the epitaxially grown semiconductor material that provides the source region and the drain region of the fin structure of a first fin field effect transistor, e.g., p-type fin field effect transistor, of a first array may be grown to extend over an isolation region to contact at least one of the source and the drain region of a second fin field effect transistor of a second array, e.g., n-type fin field effect transistor.

Figure 1B:
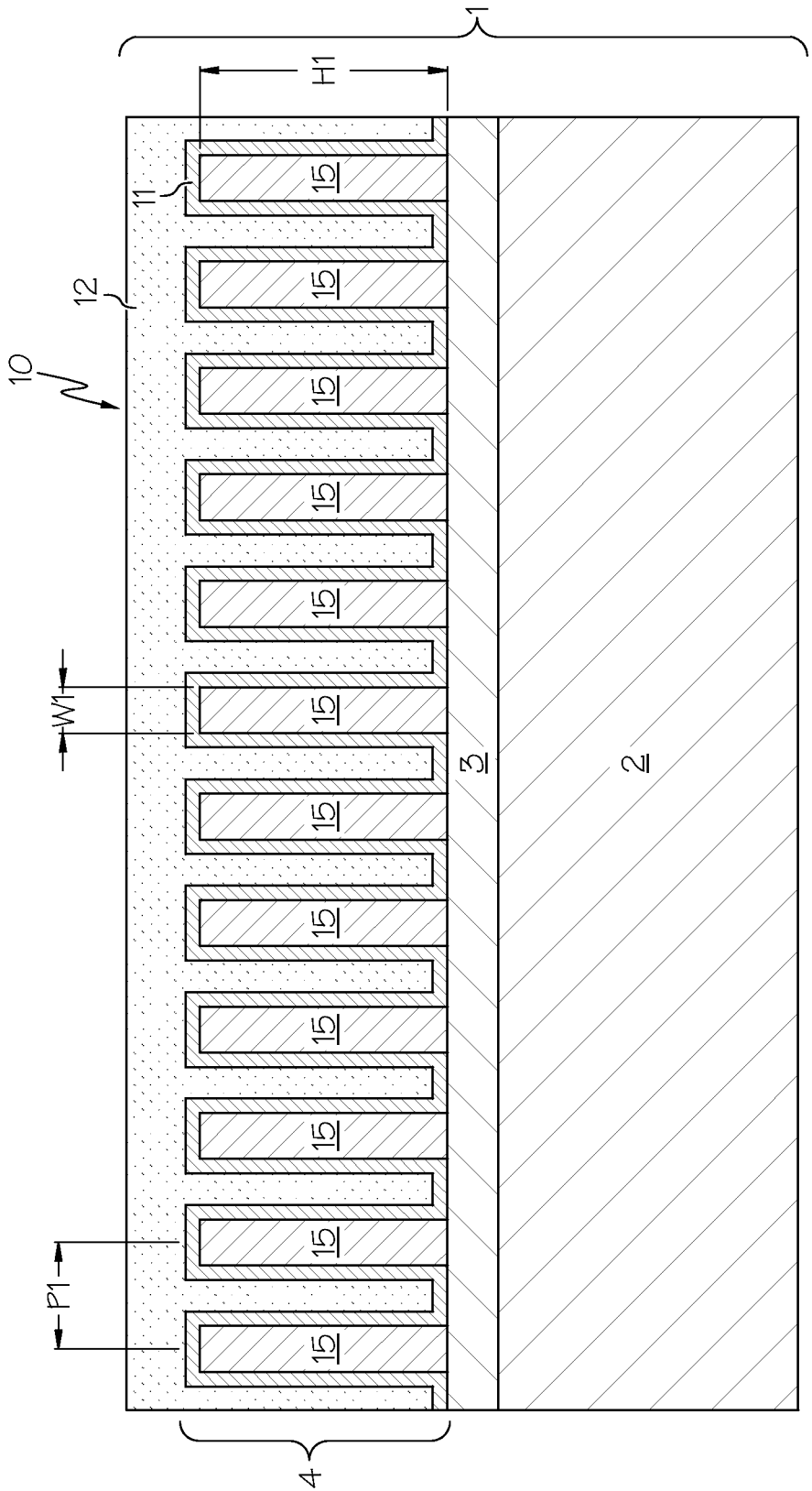
FIG. 1B is a side cross-sectional view depicting the structure along section line B-B of FIG. 1A.

In some embodiments, the methods and structures disclosed herein provide a nitride containing spacer that is positioned to obstruct the epitaxially formed semiconductor material that provides at least one of the source region and the drain region of the fin field effect transistor from growing to contact another electrical component in a manner that could cause an electrical short. Referring to FIGS. 1A and 1B, the method of forming an array of fin field effect transistors that employs a nitride containing spacer to control the growth of the epitaxially formed semiconductor material for at least a portion of the source region and the drain region may begin with forming a gate structure 10 on a plurality of fin structures 15.

The plurality of fin structures 15 may be formed from a semiconductor substrate, such as a semiconductor on insulator (SOI) substrate or a bulk semiconductor substrate. In the embodiment that is depicted in FIG. 1B, the semiconductor substrate is a semiconductor on insulator substrate 1. The semiconductor on insulator substrate 1 may include at least a first semiconductor layer 4 (also referred to as a semiconductor on insulator (SOI) layer) overlying a dielectric layer 3, in which a base semiconductor layer 2 may be present underlying the dielectric layer 3. The semiconductor material that provides the semiconductor on insulator layer 4 may be any semiconducting material including, but not limited to Si, strained Si, SiC, SiGe, SiGeC, Si alloys, Ge, Ge alloys, GaAs, InAs, and InP, or any combination thereof. In one example, the semiconductor on insulator layer 4 is composed of silicon. The semiconductor on insulator layer 4 can have a thickness ranging from 5.0 nm to 50.0 nm. In another example, the semiconductor on insulator layer 4 has a thickness ranging from 6 nm to 35 nm. The base semiconductor layer 2 may be a semiconducting material including, but not limited to Si, strained Si, SiC, SiGe, SiGeC, Si alloys, Ge, Ge alloys, GaAs, InAs, InP as well as other III/V and II/VI compound semiconductors. The base semiconductor layer 2 may have the same or a different composition than the semiconductor on insulator layer 4.

The dielectric layer 3 of the semiconductor on insulator substrate 1 may be formed by implanting a high-energy dopant into a bulk semiconductor substrate and then annealing the structure to form a buried insulating layer, i.e., dielectric layer 3. In another embodiment, the dielectric layer 3 may be deposited or grown prior to the formation of the semiconductor on insulator layer 4. In yet another embodiment, the semiconductor on insulator substrate 1 may be formed using wafer-bonding techniques, where a bonded wafer pair is formed utilizing glue, adhesive polymer, or direct bonding. In such an embodiment, at least one of the wafers being bonded together has a dielectric surface, which can form dielectric layer 3.

It is noted that the substrate that provides the plurality of fin structures 15 is not limited to being a semiconductor on insulator substrate 1, as depicted in FIG. 1B. The substrate that provides the plurality of fin structures 15 may also be a bulk semiconductor substrate. The bulk semiconductor substrate can be composed of a semiconducting material including, but not limited to Si, strained Si, SiC, SiGe, SiGeC, Si alloys, Ge, Ge alloys, GaAs, InAs, InP as well as other III/V and II/VI compound semiconductors.

Still referring to FIGS. 1A and 1B, the plurality of fin structures 15 may be formed from the substrate, e.g., semiconductor on insulator substrate 1, using photolithography and etch processes. Prior to etching the semiconductor on insulator substrate 1 to provide the plurality of fin structures 15, a layer of the dielectric material can be deposited atop the semiconductor on insulator substrate 1 to provide a dielectric fin cap (not shown). The material layer that provides the dielectric fin cap may be composed of a nitride, oxide, oxynitride material, and/or any other suitable dielectric layer. The dielectric fin cap may comprise a single layer of dielectric material or multiple layers of dielectric materials. The material layer that provides the dielectric fin cap can be formed by a deposition process, such as chemical vapor deposition and/or atomic layer deposition. Alternatively, the material layer that provides the dielectric fin cap may be formed using a growth process, such as thermal oxidation or thermal nitridation. The material layer that provides the dielectric fin cap may have a thickness ranging from 1 nm to 100 nm. In one example, the dielectric fin cap is composed of an oxide, such as $SiO_2$, that is formed by chemical vapor deposition to a thickness ranging from 25 nm to 50 nm. In one embodiment, no dielectric fin cap is present.

In one embodiment, following the formation of the layer of dielectric material that provides the dielectric fin cap, a photolithography and etch process sequence is applied to the material layer for the dielectric fin cap and the semiconductor on insulator substrate 1. Specifically, in one example, a photoresist mask is formed overlying the layer of the dielectric material that provides dielectric fin cap and is present overlying the semiconductor on insulator layer 4 of the semiconductor on insulator substrate 1, in which the portion of the dielectric material that is underlying the photoresist mask provides the dielectric fin cap, and the portion of the semiconductor on insulator layer 4 that is underlying the photoresist mask provides the plurality of fin structures 15. The exposed portions of the dielectric material that provides dielectric fin cap and the semiconductor on insulator layer 4, which are not protected by the photoresist mask, are removed using a selective etch process. To provide the photoresist mask, a photoresist layer is first positioned on the layer of the dielectric material that provides dielectric fin cap. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the dielectric material that provides the dielectric fin cap followed by removing the unprotected portion of the semiconductor on insulator layer 4 selective to the underlying dielectric layer 2. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

Each of the fin structures in the plurality of fin structures 15 may have a height $H_1$ ranging from 5 nm to 200 nm. In another embodiment, each of the plurality of fin structures 15 has a height $H_1$ ranging from 10 nm to 100 nm. In one example, each of the plurality of fin structures 15 has a height $H_1$ ranging from 20 nm to 50 nm. Each of the plurality of fin structures 15 may have a width $W_1$ of less than 20 nm. In another embodiment, each of the plurality of fin structures 15 has a width $W_1$ ranging from 3 nm to 8 nm. Although twelve fin structures are depicted in FIGS. 1A and 1B, the present disclosure is not limited to only this example. It is noted that any number of fin structures may be present in the plurality of fin structures 15. The pitch P1 separating adjacent fin structures in the plurality of fin structures 15 may range from 10 nm to 120 nm.

FIGS. 1A and 1B also depict forming a gate structure 10 on a channel portion of each of the plurality of fin structures 15. The gate structure 10 controls output current, i.e., flow of carriers in the channel portion of the fin field effect transistor (FET), through electrical or magnetic fields. The channel portion is the region between the source region and the drain region of a semiconductor device, e.g., fin field effect transistor, that becomes conductive when the semiconductor device is turned on. Typically, the gate structure 10 includes at least one gate dielectric 11 that is formed on the channel portion of each fin structure for the plurality of fin structures 15, and at least one gate conductor 12 that is formed on the at least one gate dielectric 11. The gate structure 10 may be formed by forming blanket material layers for the at least one gate dielectric 11 and the at least one gate conductor 12 to provide a gate stack, and patterning and etching the gate stack to provide the gate structures 10. The gate structures 10 can be formed utilizing photolithography and etch process steps. The gate structure 10 can be a shared gate structure that is present on the channel portion of each of the fin structures in the plurality of fin structures 15. By a "shared gate structure" it is meant that a single continuous gate structure is present on the channel region of each fin structure of the plurality of fin structures in the array.

The at least one gate dielectric 11 may comprise dielectric materials such as oxides, nitrides and oxynitrides of silicon. In some embodiments, the at least one gate dielectric 11 may be composed of a high-k dielectric material. The term "high-k", as used herein, denotes a dielectric constant that is greater than the dielectric constant of silicon oxide, which is typically equal to 4 (i.e., typically a silicon oxide) measured in vacuum at room temperature (20° C. to 25° C.). For example, the at least one gate dielectric 11 may comprise a generally higher dielectric constant dielectric materials having a dielectric constant from 8 to at least 100. Such higher dielectric constant dielectric materials may include, but are not limited to hafnium oxides, hafnium silicates, zirconium oxides, lanthanum oxides, titanium oxides, barium-strontium-titantates (BSTs) and lead-zirconate-titanates (PZTs). The at least one gate dielectric 11 may be formed using any of several methods that are appropriate to their material(s) of composition. Non limiting examples include thermal or plasma oxidation or nitridation methods, chemical vapor deposition methods (including atomic layer deposition methods) and physical vapor deposition methods.

The at least one gate conductor 12 may comprise materials including, but not limited to, metals, metal alloys, metal nitrides and metal silicides, as well as laminates thereof and composites thereof. The at least one gate conductor 12 may also comprise doped polysilicon and polysilicon-germanium alloy materials (i.e., having a dopant concentration from 1e18 to 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods. In one example, the at least one gate conductor 12 is composed of a doped polysilicon material that has a thickness from 400 to 2000 angstroms.

The shared gate structure 10 may be formed by blanket depositing the material layers for the at least one gate dielectric 11, and the at least one gate conductor 12 to provide a gate stack, wherein the gate stack is patterned and etched to provide the gate structure 10. Specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. Alternatively, the shared gate structure 10 can be formed by replacement gate technology. In replacement gate process sequence, a sacrificial gate structure is formed at this stage of the process flow. The sacrificial gate structure may also be referred to as a dummy gate. The sacrificial gate structure may be composed of a semiconductor material. Later in the process sequence, the sacrificial gate structure is removed, and replaced with a function gate structure having at least one gate dielectric 11 and the at least one gate conductor 12, as described above. In some instances, in the replacement gate method, the functional gate structure may be formed after the source and drain regions have been processed.

A gate sidewall spacer (not shown) may be formed in direct contact with the shared gate structure 10. The gate sidewall spacer may be formed by depositing a conformal layer of dielectric material, such as oxides, nitrides or oxynitrides, on the shared gate structure 10 followed by an etch process that removes the conformal layer from all of the surfaces of the shared gate structure 10 and the plurality of fin structures 15 except for the sidewalls of the shared gate structure 10. The gate sidewall spacer may have a width ranging from 1 nm to 10 nm, typically ranging from 1 nm to 5 nm. Following the formation of the gate sidewall spacer, source extension regions and drain extension region may then be formed on the exposed sidewalls of the plurality of fin structures 15. The source extension regions and drain extension regions can be formed in each of the fin structures of the plurality of fin structures 15 on opposing sides of the shared gate structure 10 using ion implantation. In another embodiment, the source extensions regions and drain extension regions may be formed by forming an in-situ doped material on the exposed portions of the plurality of fin structures 15, and diffusing dopant from the in-situ doped material into the sidewalls of the plurality of fin structures 15.

In the embodiments, in which the fin field effect transistors that are being formed from the first plurality of fin structures 15 are p-type semiconductor devices, i.e., p-type fin field effect transistors, the source extension region and the drain extension region are doped to a p-type conductivity. As used herein, "p-type" refers to the addition of impurities to an intrinsic semiconductor that creates deficiencies of valence electrons. The p-type conductivity semiconductor devices are typically produced within silicon containing materials by doping the source extension region and the drain extension region with elements from group III-A of the Periodic Table of Elements. In a silicon-containing fin structure, examples of p-type dopants, i.e., impurities, include but are not limited to boron, aluminum, gallium and indium. In the embodiments in which the fin field effect transistors that are being formed from the first plurality of fin structures 15 are n-type semiconductor devices, the source extension region and the drain extension region are doped to an n-type conductivity. As used herein, "n-type" refers to the addition of impurities that contributes free electrons to an intrinsic semiconductor. N-type conductivity semiconductor devices are typically produced within silicon containing material by doping the source extension regions and the drain extension regions with elements from group V-A of the Periodic Table of Elements. In a silicon containing fin structure, examples of n-type dopants, i.e., impurities, include but are not limited to, antimony, arsenic and phosphorous.

Figure 2:
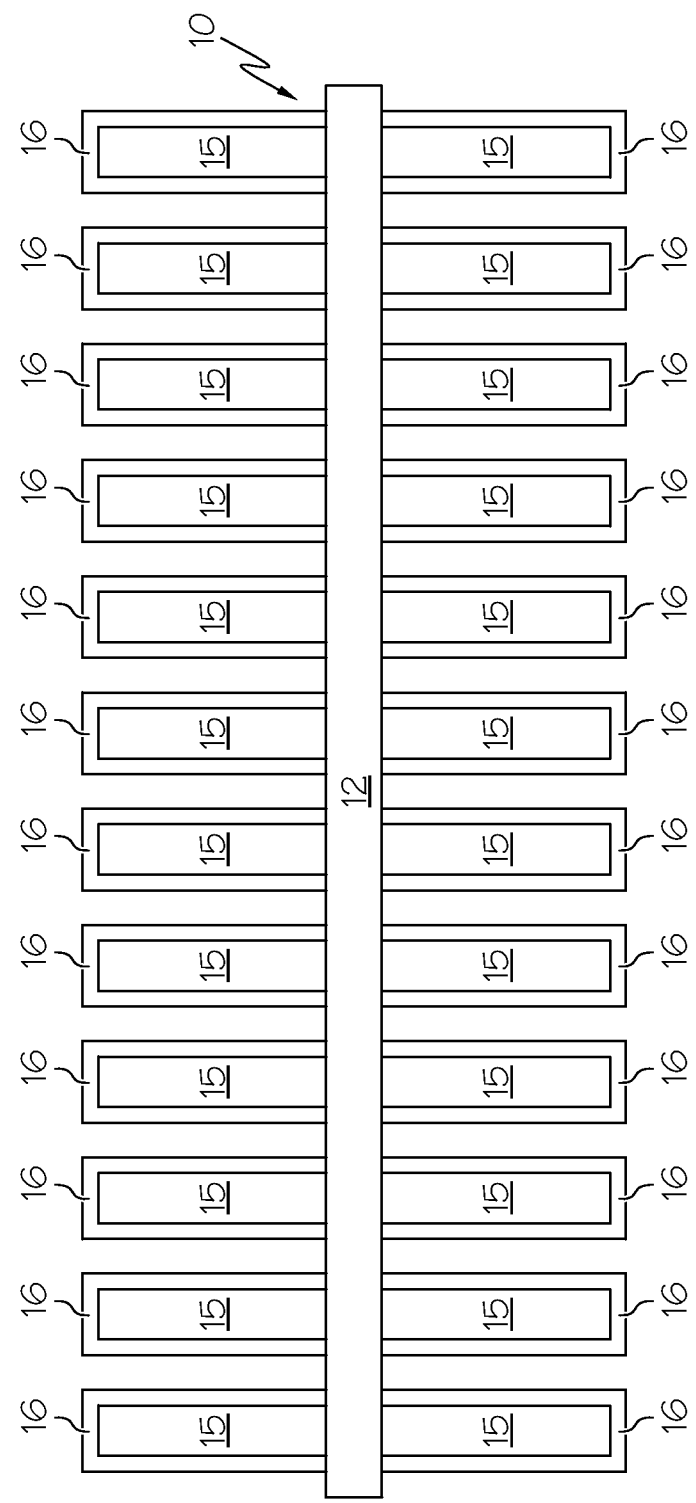
FIG. 2 is a top down view depicting forming a sacrificial material layer on the plurality of fin structures.

FIG. 2 depicts one embodiment of forming a sacrificial material layer 16 on the plurality of fin structures 15. The sacrificial material layer 16 is optional, and in some embodiments may be omitted. The sacrificial material layer 16 is a conformal dielectric layer. The term "conformal" denotes a layer having a thickness that does not deviate from greater than or less than 20% of an average value for the thickness of the layer. The term "conformally deposited" denotes a deposition method that forms a conformal layer. The conformal dielectric layer that provides the sacrificial material layer 16 can be present on the sidewall and end surfaces for each fin structure in the plurality of fin structures 15. The conformal dielectric layer that provides the sacrificial material layer 16 may be an oxide, nitride or oxynitride material. In one example, the sacrificial material layer 16 is composed of silicon oxide ($SiO_2$). In another example, the sacrificial material layer 16 is composed of silicon nitride ($Si_3N_4$). The sacrificial material layer 16 may be conformally deposited by a chemical vapor deposition process. For example, the sacrificial material layer 16 can be deposited using plasma enhanced chemical vapor deposition (PECVD), metal organic chemical vapor deposition (MOCVD), atomic layer deposition (ALD) or a combination thereof. The sacrificial material layer 16 may also be conformally deposited using a thermal growth process, such as thermal oxidation. The thickness of the sacrificial material layer 16 may be no greater than half of the space between two adjacent fin structures in the plurality of fin structures 15.

Figure 3:
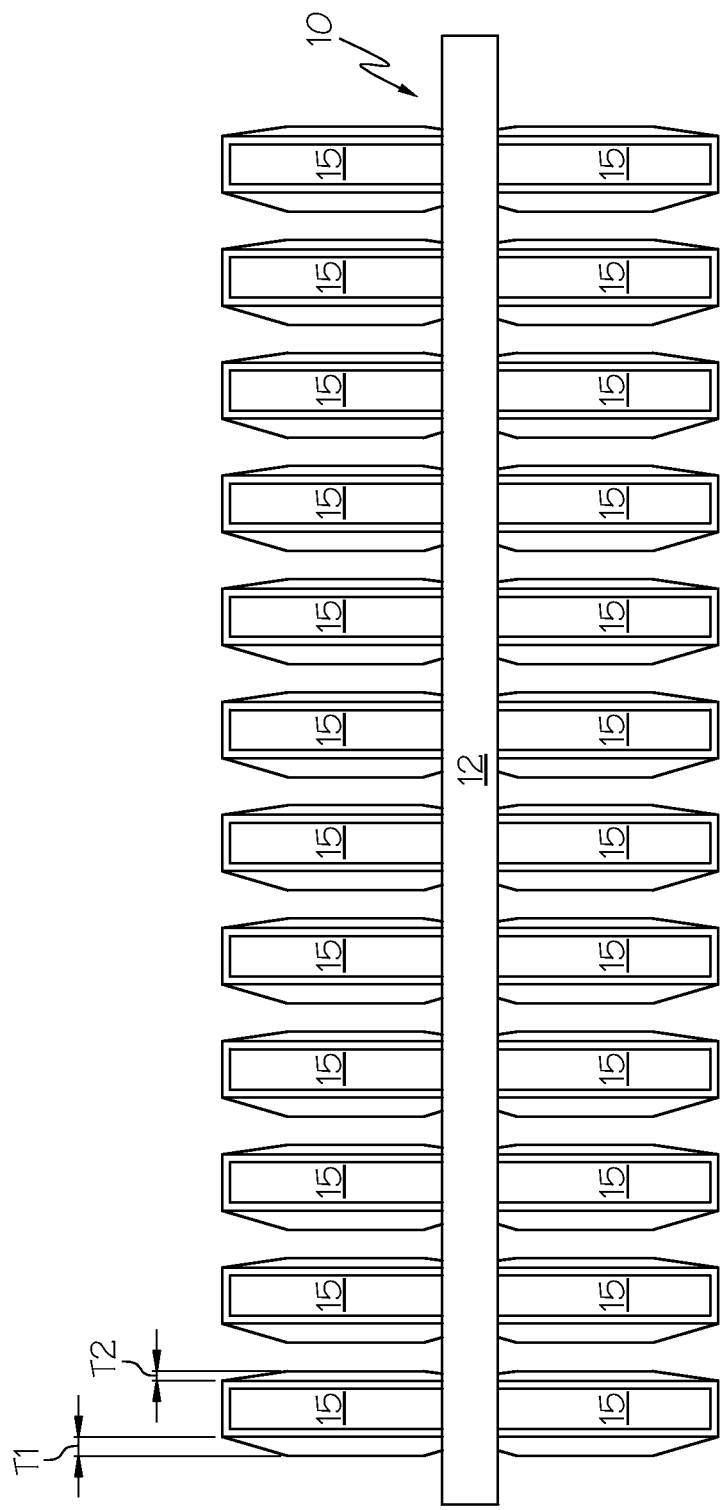
FIG. 3 is a top down view depicting forming a nitride containing layer on the sacrificial material layer for each of the fin structures, wherein a first thickness of the nitride containing layer on outermost sidewalls of the plurality of fin structures is greater than a second thickness for the remainder of the nitride containing layer.

FIG. 3 depicts forming a nitride containing layer 17 on the sacrificial material layer 16 for each of the fin structures of the plurality of fin structures 15. The nitride containing layer 17 may be a metal nitride layer. In one example, the nitride containing layer 17 is composed of titanium nitride (TiN). It is not intended that the nitride containing layer 17 be limited to only titanium nitride (TiN), because any nitride containing composition that can obstruct the subsequent epitaxial growth of the semiconductor material for the source contact regions and the drain contact regions is suitable for the nitride containing layer 17. For example, the nitride containing layer 17 may also be composed of silicon nitride, aluminum nitride, hafnium nitride, tantalum nitride (TaN), tungsten nitride (WN), silver nitride, platinum nitride, as well as alloys and combinations thereof.

In one embodiment, a first thickness T1 of the nitride containing layer 17 is present on outermost sidewalls of the plurality of fin structures 15, which is greater than a second thickness T2 for the remainder of the nitride containing layer 17. The outermost sidewalls of the plurality of fin structures 15 are the outside sidewalls of the fin structure at each end of the array. The term "present on" means that a first element, such as a first structure, is present on a second element, such as a second structure, wherein intervening elements, such as an interface structure, e.g. interface layer, may be present between the first element and the second element. For example, although the nitride containing layer 17 may be present on the outermost sidewalls of the plurality of fin structures 15, this portion may be separated from being in direct contact with the outermost sidewalls of the plurality of fin structures 15 by the sacrificial material layer 16. At this stage of the process sequence the sacrificial material layer 16 may be present between and in direct contact with the sidewalls of the plurality of fin structures 15 and the nitride containing layer 17.

In one embodiment, the first thickness T1 of the nitride containing layer 17 may range from 50 nm to 6 nm, and the second thickness T2 of the nitride containing layer 17 may range from 13 nm to 2 nm. In another embodiment, the first thickness T1 of the nitride containing layer 17 may range from 15 nm to 10 nm, and the second thickness T2 of the nitride containing layer 17 may range from 6 nm to 3 nm. It is noted that the above thicknesses are provided for illustrative purposes only, and are not intended to limit the present disclosure. Other values for the first thickness T1 and the second thickness T2 of the nitride containing layer 17 are within the scope of the present disclosure, so long as the values selected allow for the second thickness T2 of the nitride containing layer 17 to be removed using an etch process so that a portion of the first thickness T1 of the nitride containing layer 17 remains to provide nitride containing spacers.

The nitride containing layer 17 may be deposited using a physical vapor deposition (PVD) method. For example, the nitride containing layer 17 may be formed using a sputtering process. As used herein, "sputtering" means a method of depositing a film of metallic material, in which a target of the desired material, i.e., source, is bombarded with particles, e.g., ions, which knock atoms from the target, and the dislodged target material deposits on the deposition surface. Examples of sputtering apparatus that may be suitable for depositing the nitride containing layer 17 include DC diode type systems, radio frequency (RF) sputtering, magnetron sputtering, and ionized metal plasma (IMP) sputtering.

A sputtering deposition process for depositing a nitride containing layer 17 of titanium nitride (TiN) may include applying high energy particles to strike a solid slab of a titanium target material, in which the high energy particles physically dislodge atoms of titanium to be deposited on the sacrificial material layer 16. The sputtered atoms of titanium typically migrate through a vacuum and deposit on the deposition surface, e.g., the sacrificial material layer 16. The source of nitrogen for the titanium nitride (TiN) may be provided by nitrogen gas ($N_2$). The nitrogen source may be introduced to the sputtering chamber, as the sputtered atoms of titanium are migrating towards the deposition surface, e.g., the sacrificial material layer 16. In some embodiments, a thicker layer of the deposited nitride containing material is formed on the outermost sidewalls of the plurality of fin structures 15 than the remaining portion of the nitride containing layer 17 that is present on the inner sidewalls of the adjacent fin structures, because the outermost sidewalls at the end of the array are most exposed, and are therefore more available as a deposition surface for the nitride containing layer 17.

Figure 4:
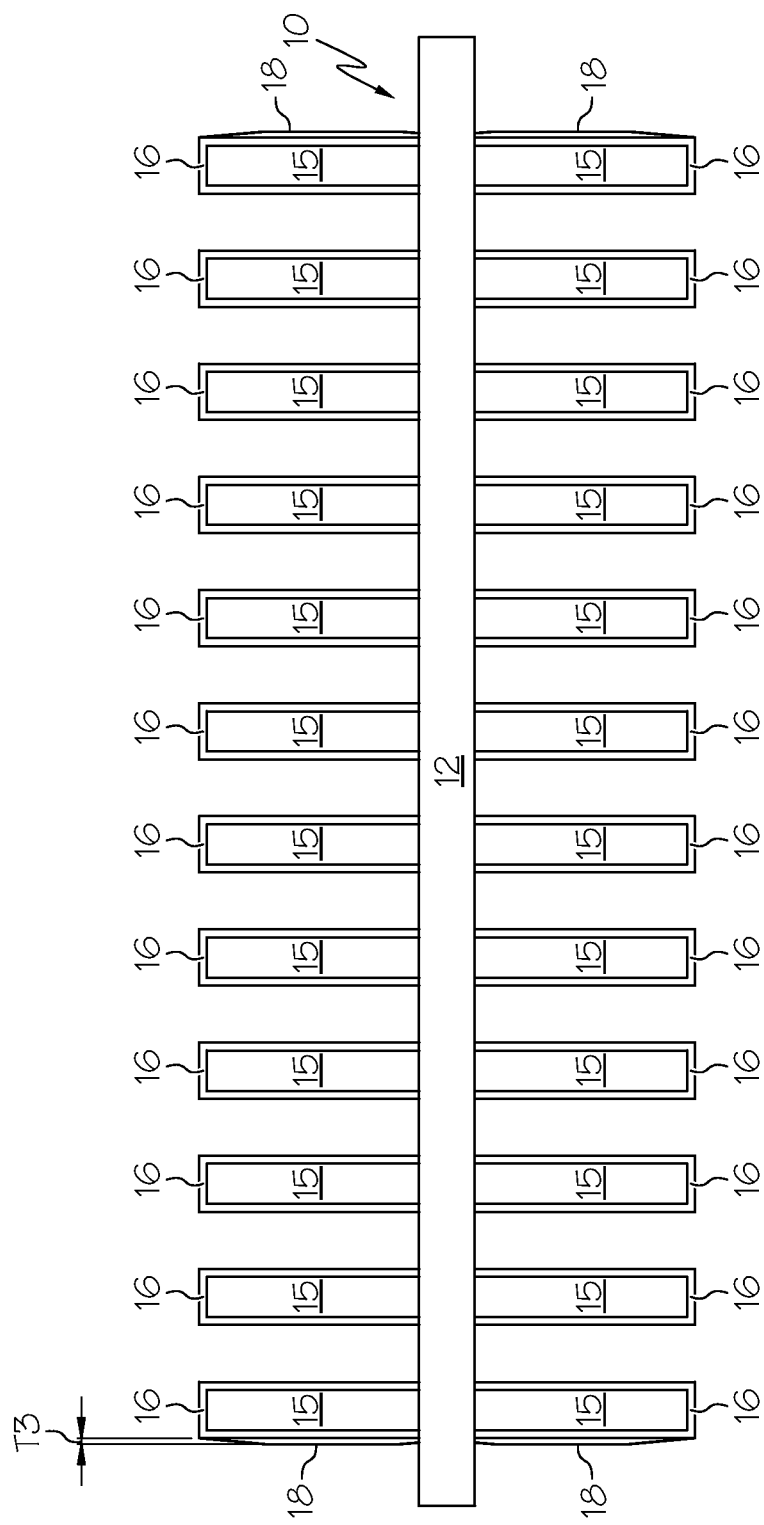
FIG. 4 is a top down view depicting etching the nitride containing layer to remove the portions of the nitride containing layer having the second thickness, wherein a remaining portion of the first thickness of the nitride containing layer provides a nitride containing spacer on the sacrificial material layer that is present on the outermost sidewalls of the plurality of fin structures.

FIG. 4 depicts etching the nitride containing layer 17 to remove the portions of the nitride containing layer 17 having the second thickness T2, wherein a remaining portion T3 of the first thickness of the nitride containing layer 17 provides a nitride containing spacer 18 on the sacrificial material layer 16 that is present on the outermost sidewalls of the plurality of fin structures 15. The etch process for removing the portion of the nitride containing layer 17 having the second thickness is typically an isotropic etch process. The term "isotropic etch" denotes an etch process that is non-directional. By "non-directional" it is meant that the etch rate is not substantially greater in any one direction in comparison to all of the etch directions. The isotropic etch may be a wet chemical etch or a dry etch. For example, the etchant may be a liquid or a chemically active ionized gas, such as a plasma. In some embodiments, the etch process for removing the portion of the nitride containing layer having the second thickness is an etch process that is selective to the sacrificial material layer 16. As used herein, the term "selective" in reference to a material removal process denotes that the rate of material removal for a first material is greater than the rate of removal for at least another material of the structure to which the material removal process is being applied. For example, a selective etch may remove one material to a second material at a rate that is greater than 10:1. In another example, a selective etch may remove one material to a second material at a rate that is greater than 100:1. TiN can be etched selectively by an aqueous etchant containing SC1, which is a solution containing $NH_4OH$ (ammonium hydroxide)+$H_2O_2$ (hydrogen peroxide)+$H_2O$ (water).

Following the isotropic etch process for removing the portions of the nitride containing layer 17 having the second thickness, the remaining portion T3 of the first thickness of the nitride containing layer 17 that provides the nitride containing spacer 18 may range from 12 nm to 2 nm. In another embodiment, the remaining portion T3 of the first thickness of the nitride containing layer 17 that provides the nitride containing spacer 18 may range from 8 nm to 3 nm.

Figure 5:
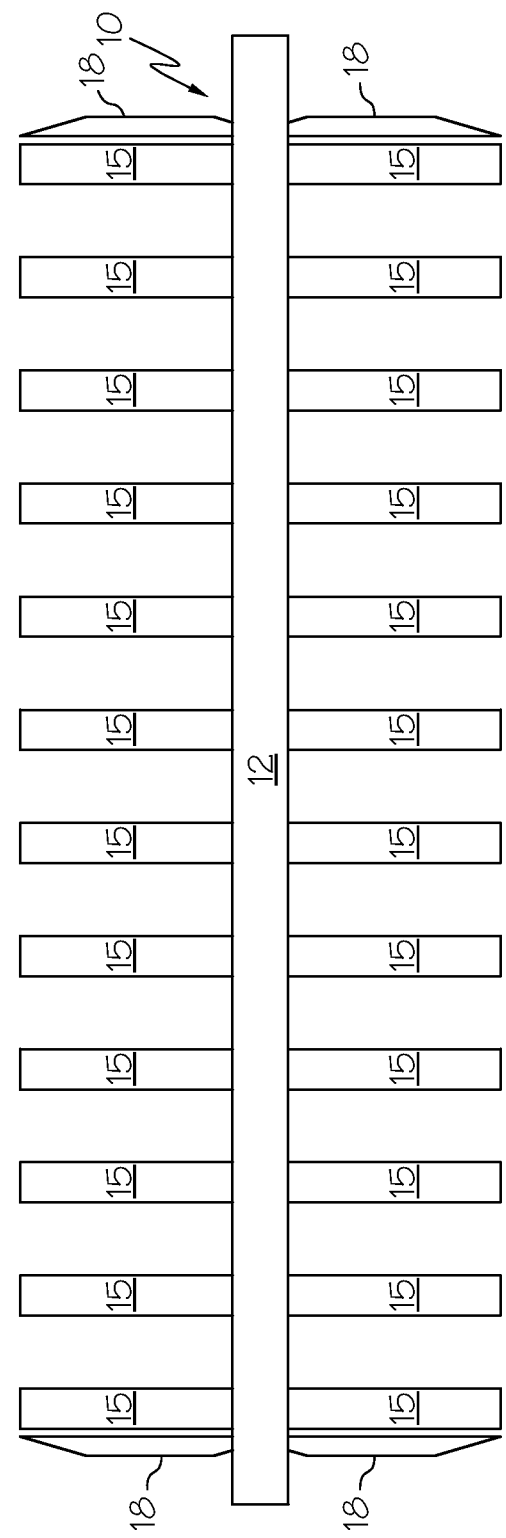
FIG. 5 is a top down view depicting removing the sacrificial material layer.

FIG. 5 depicts removing the sacrificial material layer 16. The sacrificial material layer 16 can be removed using a selective etch process. The etch process for removing the sacrificial material layer 16 can be a wet chemical etch or a dry etch. More specifically, the sacrificial material layer 16 can be removed by an etch process that is selective to the plurality of fin structures 15, the shared gate structure 10 and the nitride containing spacer 18. In one example, when the sacrificial material layer 16 is composed of silicon oxide ($SiO_2$), the nitride containing spacer 18 is composed of titanium nitride (TiN) and the plurality of fin structures 15 are composed of silicon (Si), the etch chemistry for removing the sacrificial material layer 16 may be COR (chemical oxide etch) or an aqueous solution containing hydrofluoric acid. Removing the sacrificial material layer 16 can expose the sidewalls (inner and outer sidewalls) of the plurality of fin structures 15.

Figure 6A:
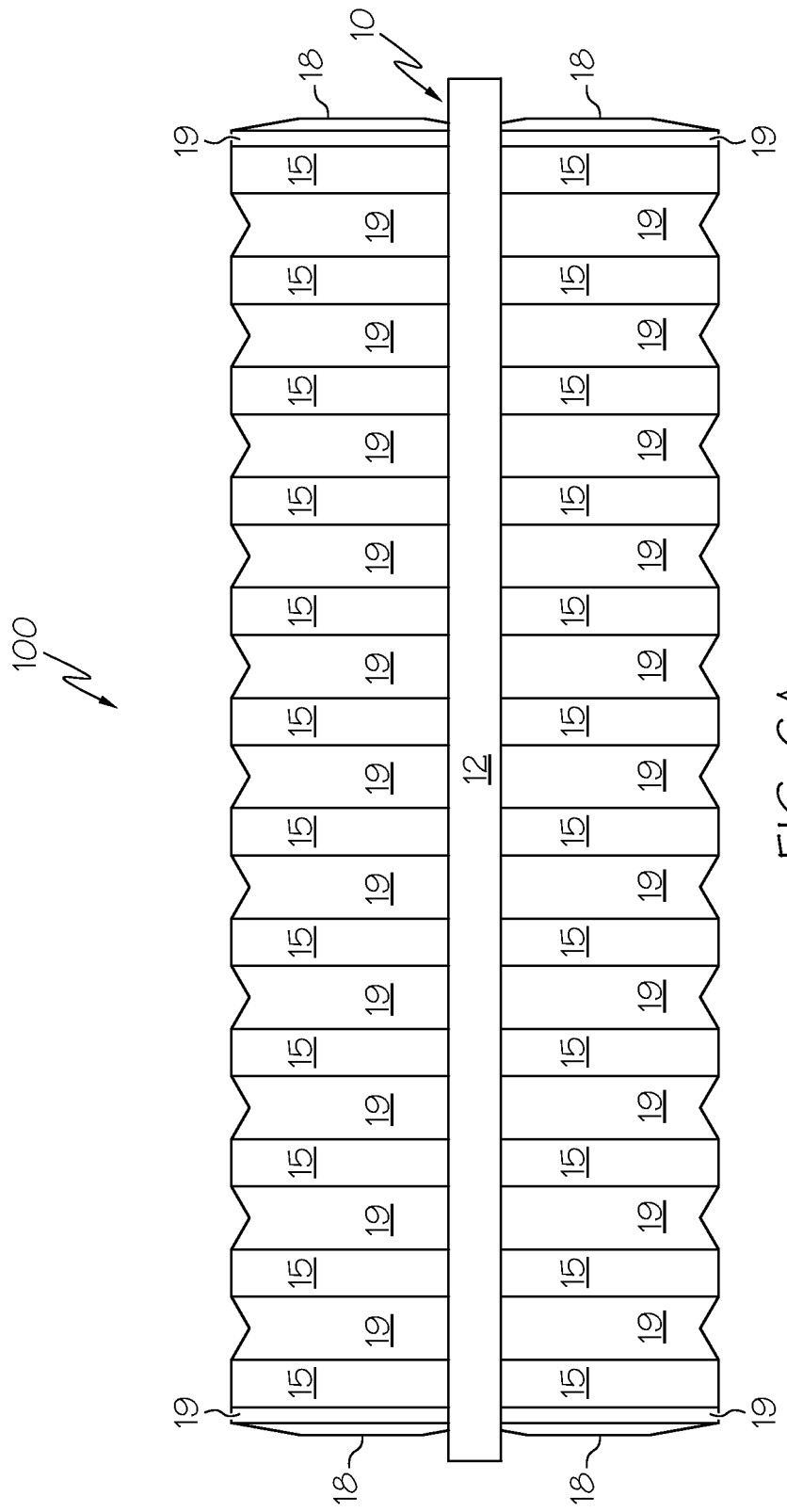
FIG. 6A is a top down view depicting forming source regions and drain regions of an epitaxial semiconductor material on the plurality of fin structures.
Figure 6B:
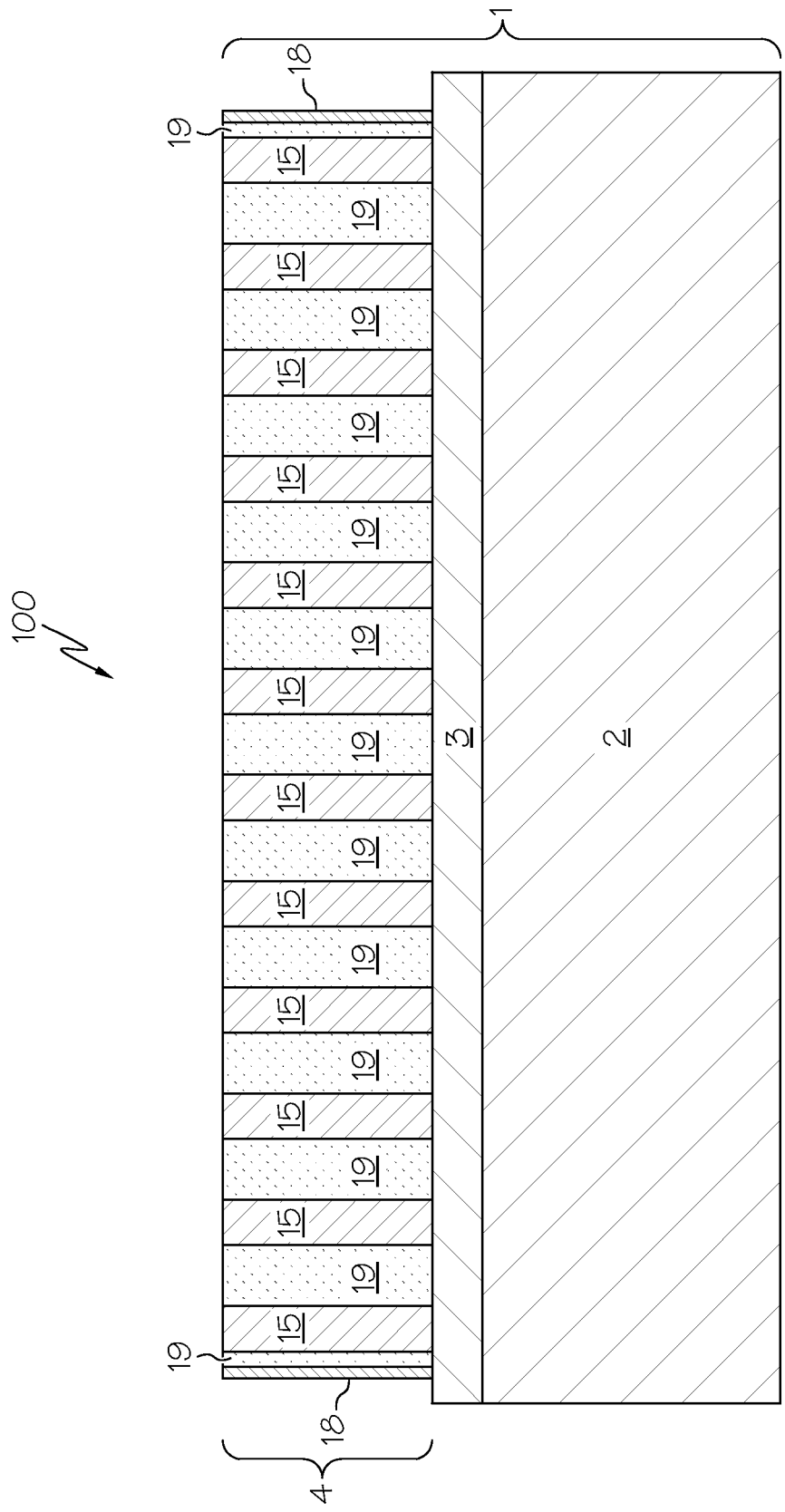
FIG. 6B is a side view of the structure depicted in FIG. 6A.

FIGS. 6A and 6B depict forming source contract regions and drain contact regions of an epitaxial semiconductor material 19 on the plurality of fin structures 15. The source contact regions and drain contact regions are the portions of the source region and the drain region to the fin field effect transistors that are contacted by interconnects communicating electrical signals to/from the fin field effect transistors. The combination of the source contact region and the drain contact region and the source extension region and the drain extension region may provide the source region and drain region to the fin field effect transistor. "Epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation. In some embodiments, the epitaxial deposition process is a selective deposition process. More specifically, in one embodiment, the epitaxial semiconductor material being deposited for the source contact region and the drain contact region is only deposited on semiconductor containing deposition surfaces, such as the sidewalls of the plurality of fin structures 15 that were exposed by removing the sacrificial material layer 16. The epitaxial semiconductor material 19 being deposited for the source and drain contact regions is typically not deposited on dielectric materials, such as the nitride containing spacers 18 that are present at the ends of the plurality of fin structures 15 within the array of fin field effect transistors.

The epitaxial semiconductor material 19 may be composed of any semiconductor material that can be epitaxially deposited. Some examples of semiconductor materials that are suitable for the epitaxial semiconductor material 19 include silicon (Si), germanium (Ge), and silicon germanium (SiGe). It is noted that these specific material compositions for the epitaxial semiconductor material 19 are provided for illustrative purposes only, and are not intended to limit the present disclosure, as any semiconductor material that may be formed using an epitaxial growth process is suitable for the epitaxial semiconductor material 19. A number of different sources may be used for the deposition of epitaxial silicon. In some embodiments in which the epitaxial semiconductor material 19 is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In other embodiments in which the epitaxial semiconductor material 19 is composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In yet other embodiments in which the epitaxial semiconductor material 19 is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

The temperature for epitaxial deposition typically ranges from 550° C. to 900° C. Although higher temperature typically results in faster deposition, the faster deposition may result in crystal defects and film cracking. The apparatus for performing the epitaxial growth may include a chemical vapor deposition apparatus, such as atmospheric pressure chemical vapor deposition, low pressure chemical vapor deposition, plasma enhanced chemical vapor deposition, metal-organic chemical vapor deposition and others.

The epitaxial semiconductor material 19 may have the same conductivity type as the source extension regions and the drain extension regions. For example, when the source extension regions and the drain extension regions have a p-type conductivity, the epitaxial semiconductor material that provides the source contact regions and the drain contact regions may also have a p-type conductivity. In another example, when the source extension regions and the drain extension regions have an n-type conductivity, the epitaxial semiconductor material that provides the source contact regions and the drain contact regions may also have an n-type conductivity. The dopant that provides the conductivity type of epitaxial semiconductor material 19 may be introduced using an in-situ doping process or using ion implantation. By "in-situ" it is meant that the dopant that provides the conductivity type of the material layer is introduced as the material layer is being formed or deposited, e.g., during the epitaxial deposition process. For example, when doping the doped semiconductor material concurrently with the epitaxial growth process, a gas source for the dopant is introduced to the semiconductor material being grown simultaneously with the gas source that provides the precursor for epitaxially forming the semiconductor material. In one example, the gaseous dopant sources for in-situ doping include $PH_3$, $B_2H_6$, $AsH_3$ and combinations thereof. In another embodiment, the epitaxial semiconductor material 19 may be doped via ion implantation.

FIGS. 6A and 6B depict one embodiment of an array of fin field effect transistors 100 that includes a plurality of fin structures 15 on a substrate, e.g., semiconductor on insulator substrate 1, and a shared gate structure 10 on a channel portion of the plurality of fin structures 15. The fin field effect transistor 100 further includes an epitaxial semiconductor material 19 that provides the source contact regions and the drain contact regions. The epitaxial semiconductor material 19 may include a first portion between adjacent fin structures in the plurality of fin structures 15, and a second portion present on outermost sidewalls of end fin structures of the plurality of fin structures 15. A nitride containing spacer 18 is present on outermost sidewalls of the second portion of the epitaxial semiconductor material 19. In some embodiments, the nitride containing spacer 18 is present in contact with the entire sidewall, i.e., entire height, of the outermost sidewall of the second portion of the epitaxial semiconductor material 19.

The positioning of the nitride containing spacer 18 obstructs the epitaxial semiconductor material 19 from extending past the end of the shared gate structure 10. By blocking the epitaxial semiconductor material 19 from extending past the end of the shared gate structure 10, the nitride containing spacer 18 eliminates shorting between of the portions of the epitaxial semiconductor material 19 that provides the source contact region of the fin field effect transistor 100 and the portions of the epitaxial semiconductor material 19 that provides the drain contact region of the fin field effect transistor 100. The nitride containing spacer 18 may also obstruct the epitaxial semiconductor material 19 from a first array of fin field effect transistors from extending over an isolation region into contact with a second array of fin field effect transistors.

While the present disclosure has been particularly shown and described with respect to preferred embodiments thereof, it will be understood by those skilled in the art that the foregoing and other changes in forms and details may be made without departing from the scope and spirit of the present disclosure. It is therefore intended that the present disclosure not be limited to the exact forms and details described and illustrated, but fall within the scope of the appended claims.

What is claimed is:

1. A semiconductor device comprising:
   a plurality of fin structures on a substrate;
   a gate structure on a channel portion of each fin structure of the plurality of fin structures;
   an epitaxial semiconductor material including a first portion between adjacent fin structures in the plurality of fin structures and a second portion present on outermost sidewalls of end fin structures of the plurality of fin structures, wherein the epitaxial semiconductor material provides at least a portion of a source region and a drain region to each fin structure of the plurality of fin structures; and
   a nitride containing spacer on each outermost sidewall of the second portion of the epitaxial semiconductor material.

2. The semiconductor device of claim 1, wherein the nitride containing spacer is in contact with an entire height of each outermost sidewall of the second portion of the epitaxial semiconductor material.

3. The semiconductor device of claim 1, wherein the nitride containing spacer is selected from the group consisting of silicon nitride, hafnium nitride, aluminum nitride, tantalum nitride, titanium nitride, tungsten nitride, silver nitride, platinum nitride and a combination thereof.

4. The semiconductor device of claim 1, wherein the nitride containing spacer has a thickness ranging from 3 nm to 8 nm.

5. The semiconductor device of claim 1, wherein the fin structure has a height ranging from 5 nm to 200 nm, and a width ranging from 2 nm to 20 nm.

6. The semiconductor device of claim 1, wherein the plurality of fin structures are composed of a semiconductor material that is selected from the group consisting of Si, strained Si, SiC, SiGe, SiGeC, Si alloys, Ge, Ge alloys, GaAs, InAs, InP, III/V and II/VI compound semiconductors and a combination thereof.

7. The semiconductor device of claim 1, wherein the epitaxial semiconductor material is composed of a semiconductor material that is selected from the group consisting of Si, strained Si, SiC, SiGe, SiGeC, Si alloys, Ge, Ge alloys, GaAs, InAs, InP, III/V and II/VI compound semiconductors and a combination thereof.

8. The semiconductor device of claim 1, wherein the second portion of the epitaxial semiconductor material has a thickness less than a thickness of the first portion of the epitaxial semiconductor material.

9. The semiconductor device of claim 8, wherein the thickness of the second portion of the epitaxial semiconductor material is no greater than half of a space between two adjacent fin structures in the plurality of fin structures.

10. The semiconductor device of claim 1, wherein the gate structure comprises at least one gate dielectric present on the channel portion of each fin structure of the plurality of fin structure and at least one gate conductor present on the at least one gate dielectric.

11. The semiconductor device of claim 1, wherein the gate structure is a sacrificial gate structure to be replaced by a functional gate structure comprising at least one gate dielectric present on the channel portion of each fin structure of the plurality of fin structure and at least one gate conductor present on the at least one gate dielectric.

12. A semiconductor device comprising:
   a plurality of fin structures on a substrate;
   a gate structure on a channel portion of each fin structure of the plurality of fin structure;
   an epitaxial semiconductor material present between adjacent fin structures in the plurality of fin structures and, wherein the epitaxial semiconductor material provides at least a portion of a source region and/or a drain region to each fin structure of the plurality of fin structures; and a nitride containing spacer in direct contact with each outermost sidewall of end fin structures of the plurality of fin structures.

13. The semiconductor device of claim 12, wherein the nitride containing spacer is in contact with an entire height of each outermost sidewall of the end fin structures of the plurality of fin structures.

14. The semiconductor device of claim 12, wherein the nitride containing spacer is selected from the group consisting of silicon nitride, hafnium nitride, aluminum nitride, tantalum nitride, titanium nitride, tungsten nitride, silver nitride, platinum nitride and a combination thereof.

15. The semiconductor device of claim 12, wherein the nitride containing spacer has a thickness ranging from 3 nm to 8 nm.

16. The semiconductor device of claim 12, wherein the fin structure has a height ranging from 5 nm to 200 nm, and a width ranging from 2 nm to 20 nm.

17. The semiconductor device of claim 12, wherein the plurality of fin structures are composed of a semiconductor material that is selected from the group consisting of Si, strained Si, SiC, SiGe, SiGeC, Si alloys, Ge, Ge alloys, GaAs, InAs, InP, III/V and II/VI compound semiconductors and a combination thereof.

18. The semiconductor device of claim 12, wherein the epitaxial semiconductor material are composed of a semiconductor material that is selected from the group consisting of Si, strained Si, SiC, SiGe, SiGeC, Si alloys, Ge, Ge alloys, GaAs, InAs, InP, III/V and II/VI compound semiconductors and a combination thereof.

19. The semiconductor device of claim 12, wherein the gate structure comprises at least one gate dielectric present on the channel portion of each fin structure of the plurality of fin structure and at least one gate conductor present on the at least one gate dielectric.

20. The semiconductor device of claim 12, wherein the gate structure is a sacrificial gate structure to be replaced by a functional gate structure comprising at least one gate dielectric present on the channel portion of each fin structure of the plurality of fin structure and at least one gate conductor present on the at least one gate dielectric.

* * * * *